United States Patent
Thierry-Jebali et al.

(10) Patent No.: US 11,581,431 B2
(45) Date of Patent: Feb. 14, 2023

(54) INTEGRATION OF A SCHOTTKY DIODE WITH A MOSFET

(71) Applicant: II-VI Delaware, Inc, Wilmington, DE (US)

(72) Inventors: Nicolas Thierry-Jebali, Stockholm (SE); Hossein Elahipanah, Sollentuna (SE); Adolf Schöner, Hässelby (SE); Sergey Reshanov, Upplands-Vasby (SE)

(73) Assignee: II-VI DELAWARE, INC., Wilmington, DE (US)

( * ) Notice: Subject to any disclaimer, the term of this patent is extended or adjusted under 35 U.S.C. 154(b) by 16 days.

(21) Appl. No.: 17/444,817

(22) Filed: Aug. 10, 2021

(65) Prior Publication Data

US 2022/0029010 A1 Jan. 27, 2022

Related U.S. Application Data

(63) Continuation of application No. 16/647,186, filed as application No. PCT/EP2018/074909 on Sep. 14, 2018, now Pat. No. 11,114,557.

(30) Foreign Application Priority Data

Sep. 15, 2017 (SE) .................................... 1751139-5

(51) Int. Cl.
*H01L 29/78* (2006.01)
*H01L 29/10* (2006.01)
(Continued)

(52) U.S. Cl.
CPC ...... *H01L 29/7803* (2013.01); *H01L 27/0727* (2013.01); *H01L 29/0623* (2013.01);
(Continued)

(58) Field of Classification Search
CPC . H01L 29/7806; H01L 29/1095; H01L 29/47; H01L 29/7803; H01L 29/0623; H01L 27/0727
See application file for complete search history.

(56) References Cited

U.S. PATENT DOCUMENTS 5,693,569 A 12/1997 Ueno
2,705,406 A 1/1998 Rottner et al.
(Continued)

FOREIGN PATENT DOCUMENTS

CN 103000698 A 3/2013
EP 2058854 A2 5/2009
(Continued)

OTHER PUBLICATIONS

Japanese Office Action dated Jul. 6, 2022, with Machine Translation.
(Continued)

*Primary Examiner* — Joseph C. Nicely
(74) *Attorney, Agent, or Firm* — Blank Rome LLP

(57) ABSTRACT

There is disclosed the integration of a Schottky diode with a MOSFET, more in detail there is a free-wheeling Schottky diode and a power MOSFET on top of a buried grid material structure. Advantages of the specific design allow the whole surface area to be used for MOSFET and Schottky diode structures, the shared drift layer is not limited by Schottky diode or MOSFET design rules and therefore, one can decrease the thickness and increase the doping concentration of the drift layer closer to a punch through design compared to the state of the art. This results in higher conductivity and lower on-resistance of the device with no influence on the voltage blocking performance. The integrated device can operate at higher frequency. The risk for bipolar degradation is avoided.

19 Claims, 6 Drawing Sheets

(51) Int. Cl.
*H01L 29/47* (2006.01)
*H01L 27/07* (2006.01)
*H01L 29/06* (2006.01)
*H01L 29/872* (2006.01)

(52) U.S. Cl.
CPC .......... *H01L 29/1095* (2013.01); *H01L 29/47* (2013.01); *H01L 29/7806* (2013.01); *H01L 29/872* (2013.01)

(56) References Cited

U.S. PATENT DOCUMENTS

| | | | |
|---|---|---|---|
| 6,049,108 | A | 4/2000 | Williams et al. |
| 6,091,108 | A | 7/2000 | Harris et al. |
| 6,104,043 | A | 8/2000 | Hermansson et al. |
| 6,673,662 | B2 | 1/2004 | Singh |
| 6,897,133 | B2 | 5/2005 | Collard |
| 6,936,850 | B2 | 8/2005 | Friedrichs et al. |
| 6,979,863 | B2 | 12/2005 | Ryu |
| 7,851,881 | B1 | 12/2010 | Zhao et al. |
| 8,384,182 | B2 | 2/2013 | Mazzola et al. |
| 8,633,560 | B2 | 1/2014 | Aketa |
| 8,704,295 | B1 | 4/2014 | Darwish et al. |
| 9,385,244 | B2 | 7/2016 | Hirakata |
| 9,577,046 | B1 | 2/2017 | Hori et al. |
| 2003/0040144 | A1 | 2/2003 | Blanchard et al. |
| 2003/0201464 | A1 | 10/2003 | Hokomoto |
| 2006/0255423 | A1 | 11/2006 | Ryu et al. |
| 2007/0001194 | A1 | 1/2007 | Ono et al. |
| 2007/0029573 | A1 | 2/2007 | Cheng et al. |
| 2007/0170436 | A1 | 7/2007 | Sugawara |
| 2007/0228505 | A1 | 10/2007 | Mazzola et al. |
| 2011/0021533 | A1 | 1/2011 | Cook et al. |
| 2013/0270577 | A1 | 10/2013 | Harris et al. |
| 2014/0138705 | A1 | 5/2014 | Zhang et al. |
| 2014/0169045 | A1 | 6/2014 | Ueno |
| 2014/0264564 | A1 | 9/2014 | Cheng et al. |
| 2014/0367771 | A1 | 12/2014 | Chatty et al. |
| 2015/0084125 | A1 | 3/2015 | Pala et al. |
| 2016/0126347 | A1 | 5/2016 | Wada et al. |
| 2016/0233210 | A1 | 8/2016 | Matocha et al. |
| 2018/0182885 | A1 | 6/2018 | Kobayashi |
| 2020/0243513 | A1 | 7/2020 | Schoner et al. |

FOREIGN PATENT DOCUMENTS

| | | |
|---|---|---|
| EP | 2075847 A1 | 7/2009 |
| JP | H0982988 A | 3/1997 |
| JP | H09191109 A | 7/1997 |
| JP | H11330498 A | 11/1999 |
| JP | 2004006647 A | 1/2004 |
| JP | 2005229070 A | 8/2005 |
| JP | 2009532902 A | 9/2009 |
| JP | 2014170778 A | 9/2014 |
| JP | 2015026727 A | 2/2015 |
| JP | 2015173158 A | 10/2015 |
| JP | 2015192027 A | 11/2015 |
| JP | 2016009712 A | 1/2016 |
| WO | WO-199832177 A1 | 7/1998 |
| WO | WO-199926296 A2 | 5/1999 |
| WO | WO-2015104084 A1 | 7/2015 |

OTHER PUBLICATIONS

Notice of Reasons for Refusal in counterpart JP Appl. No. 2020-537040, dated Jun. 21, 2022, 15-pgs.
Bakowski, "Prospects and Development of Vertical Normally-off JFETs in SiC," Journal of Telecommunications and Information Technology, Apr. 2009, pp. 25-36.
Schoner et al., "(Invited) Progress in Buried Grid Technology for Improvements in on-Resistance of High Voltage SiC Devices",ECS Transactions.vol. 75, No. 12, Sep. 23, 2016 (Sep. 2016), pp. 183-190.
Sung et al., On Developing One-Chip Integration of 1.2 kV SiC MOSFET and JBS Diode (JBSFET) in IEEE Transactions on Industrial Electronics, vol. 64, Issue: 10, Oct. 2017.
Sung et al., Monolithically Integrated 4H—SiC MOSFET and JBS Diode (JBSFET) Using a Single Ohmic/Schottky Process Scheme in IEEE Electron Device Letter, vol. 37, Issue 12, Dec. 2016, pp. 1605-1608.
International Search Report and Written Opinion for corresponding International Application No. PCT/EP2018/074909 dated Dec. 5, 2018.

INTEGRATION OF A SCHOTTKY DIODE WITH A MOSFET

This application is a continuation of U.S. application Ser. No. 16/647,186 filed Mar. 13, 2020, which is a national phase of International Application No. PCT/EP2018/074909 filed Sep. 14, 2018 and published in the English language, which claims priority to Swedish Application No. 1751139-5 filed Sep. 15, 2017, each of which are hereby incorporated herein by reference.

TECHNICAL FIELD

The present invention relates to a device consisting of a power MOSFET and a free-wheeling Schottky diode integrated on a buried grid material structure for optimum voltage blocking capability.

BACKGROUND

Some Silicon Carbide (SiC) Power MOSFETs are commercially available and there are many patent publications disclosing SiC Power MOSFET architectures. These architectures contain a p-n body diode that can be used as an anti-parallel free-wheeling diode. However, the switching frequency is limited by the speed of this body diode because this is a slow minority carrier device. The p-n body diode has also the disadvantage of having a high threshold voltage resulting in both high conduction and switching losses. A SiC p-n body diode has a high barrier of ~3V compared to ~1V of a SiC Schottky rectifier, where the latter is comparable to Si rectifiers.

In order to speed up the switching of SiC MOSFETs, a fast rectifier like a Schottky diode or a JBS diode should be used as an anti-parallel diode.

The use of an external fast rectifier is the easiest way to implement an efficient anti-parallel free-wheeling diode. However, the current rating of the fast rectifier needs to be higher than that of the MOSFETs p-n body diode to ensure that the main current path passes through the fast rectifier for negative drain current. This solution has three main drawbacks. The first one is the large area of the external fast rectifier. This external diode introduces a large parasitic output capacitance and limits the switching frequency. The second drawback is the need of wire bonding which reduce reliability in conjunctions and increase the parasitic inductance. The third drawback is the high system cost.

U.S. Pat. No. 6,979,863 discloses a VDMOSFET with an integrated JBS diode. The main benefit of this design is that both devices are integrated on the same chip. However, the integration is limited since these devices can only be integrated in parallel and do not share the same unit cell and drift layer region. As disclosed in U.S. Pat. No. 6,979,863, for instance in the drawings, the minimum size of the JBS diode is close to 10 µm. Thus, the drift region is not shared for MOSFET and JBS diode in conduction and the gain in terms of output parasitic capacitance is low. Moreover, the shared process steps for MOSFET and JBS diode processing are limited. Thus, this solution does not lead to a considerable cost reduction.

U.S. Pat. No. 5,693,569 discloses a design comprising the integration of a SiC trench MOSFET and a Schottky diode through etching an extra trench where a Schottky metal is deposited. This feature is denoted as 20 in FIGS. 1-3 of U.S. Pat. No. 5,693,569. This design has a higher integration density than the VDMOSFET solution in U.S. Pat. No. 6,979,863. However, the gate trench should be shielded against high electric field to avoid an early device breakdown. A similar double trench design is today used commercially for a trench MOSFET but the diode trench consists of a p-n junction instead of a Schottky contact in order to shield the gate trench against high electric field. This p-n junction is also used as a body diode.

In the prior art there are known devices with a Schottky area incorporated in a MOSFET, see for instance W. Sung et al *On Developing One-Chip Integration of* 1.2 kV SiC MOSFET and JBS Diode (JBSFET) in IEEE Transactions on Industrial Electronics, Volume: 64, Issue: 10, October 2017, and W. Sung et al in *Monolithically Integrated 4H-SiC MOSFET and JBS Diode (JBSFET) Using a Single Ohmic/Schottky Process Scheme* in IEEE Electron Device Letter, Volume: 37, Issue 12, December 2016. However, the JBS diode and the MOSFET are in one embodiment placed on different parts of the device chip area, and thus not sharing the same drift layer region. In another embodiment the JBS diode and the MOSFET are not combined with a buried grid.

In summary there is a need in the art to provide an improved device.

SUMMARY

It is an object of the present invention to obviate at least some of the disadvantages in the prior art and provide an improved free-wheeling Schottky diode integrated with a MOSFET on top of a buried grid material structure.

The embodiments of the present invention provide methods and solutions for monolithically integrate a Schottky diode and a DMOSFET or a Trench MOSFET on top of a buried grid material structure.

After extensive research it has been found that advantages can be obtained by integrating a power MOSFET and a Schottky diode by using a buried grid (BG) as a junction barrier to shield the electric field in blocking by a separate layer.

In a first aspect there is provided a device comprising the following parts:

a n-type substrate (1),
a n-type drift epitaxial layer (3) on the n-type substrate (1),
a n-type epitaxial regrown layer (6) on the n-type drift epitaxial layer (3),
a p-type grid layer (4) comprising a grid in the n-type drift epitaxial layer (3) and in contact with the n-type epitaxial regrown layer (6),
a p-type feeder layer (5) in the n-type drift epitaxial layer (3) and in contact with the n-type epitaxial regrown layer (6).
the grid layer (4) and the p-type feeder layer (5) are connected,
an ohmic contact (7) applied at least partially on the p-type feeder layer (5),
a p-well region (8a, 8b),
a $n^+$ source region (9a, 9b),
a gate oxide (10),
a source ohmic contact (11),
the ohmic contact (7) is connected to the source ohmic contact (11) through a metallization layer (14),
the p-well region (8a, 8b) is arranged so that it is in contact with the n-type epitaxial regrown layer (6), the $n^+$ source region (9a, 9b), the gate oxide (10), and the source ohmic contact (11),
the $n^+$ source region (9a, 9b) is arranged so that it is in contact with the p-well region (8a, 8b), the gate oxide (10), and the source ohmic contact (11),
a gate contact (12), an isolation layer (13) for gate contact area (12) insulation from metallization layer (14),
the gate oxide (10) is in contact with the p-well region (8a, 8b), the n+ source region (9a, 9b), the gate contact (12), and the isolation layer (13),
the gate oxide (10) is optionally in contact with the n-type epitaxial regrown layer (6) and source ohmic contact (11),
a Schottky contact (15)
the metallization layer (14) applied at least partially on the device and in contact with the Schottky contact (15), and the Schottky contact (15) in contact with the n-type epitaxial regrown layer (6),
a drain ohmic contact and a metallization (17).

Further aspects and embodiments are defined in the appended claims, which are specifically incorporated herein by reference.

One advantage of the design is that the whole surface area can be used for MOSFET and Schottky diode structures without sacrificing area for special structures to lower the electric field at the surface or interface to other materials. The MOSFET and Schottky diode can be placed very close to each other in the same unit cell, and thus share the same drift layer. The free-wheeling Schottky diode can be integrated with the MOSFET on almost the same area as MOSFET chip alone. Compared to using two separate chips, the total area can thus be reduced by almost 50% in some embodiments.

Another advantage is that the highest electric field appears in the drift layer (3) close to the junction to the BG regions, and thus the drift layer (3) is not limited by Schottky diode or MOSFET design rules. Therefore, one can decrease the thickness and increase the doping concentration of the drift layer (3) according to such of the punch through design for a PiN rectifier. This results in higher conductivity and lower on-resistance of the device with no influence on the voltage blocking performance. Besides the buried grid, no additional measures are necessary to handle high electric fields close to Schottky contact (15) or gate oxide (10), which gives free design and placement of the parts of the device.

Yet another advantage is that unlike the current available designs, for instance as disclosed in U.S. Pat. No. 6,979,863 in which the P-channel (P-well) is part of the shielding regions, the shared drift layer and separate BG shielding block give more freedom in design of the MOSFET and Schottky diode devices in terms of the device dimensions, the ratio of the MOSFET to Schottky diode area, the doping concentration and thickness of the P-channel (P-well) and the JFET channel, and the placement of the MOSFET and Schottky diode cells regardless of aligning to the grids thereof.

A further advantage is that the integrated device can operate at higher frequency than the standard configuration with two devices since capacitance is much lower and parasitic inductance in the connection between the separate chips is avoided.

There is further more uniform heating of the integrated chip compared to a two-chip solution when current is switched between MOSFET and Schottky diode.

Yet another advantage is the lower loss compared to using the MOSFET body diode as free-wheeling diode, due to the lower forward voltage drop of the Schottky diode. In addition, bipolar degradation is avoided.

Compared to other integrated solutions, the size of the Schottky diode in a unit cell is not limited by leakage current, and thus can be designed to the specification of the application. The activation point of the pn diode in the p-type grid layer (4) at high current can further be defined by the design of the p-type feeder layer (5). The p-type grid layer (4) may also be referred to as a buried grid or BG. The p-type feeder layer (5) may also be referred to as only "feeder".

The BG ensures avalanche capability of both MOSFET and Schottky diode in blocking mode.

A further advantage is that there is no, or very few, additional photolithographic steps to integrate the MOSFET and the Schottky diode. Thus the cost is lower compared to a two-chip solution.

BRIEF DESCRIPTION OF THE DRAWINGS

The invention is described with reference to the following drawings in which.

DETAILED DESCRIPTION

Figure 1A:
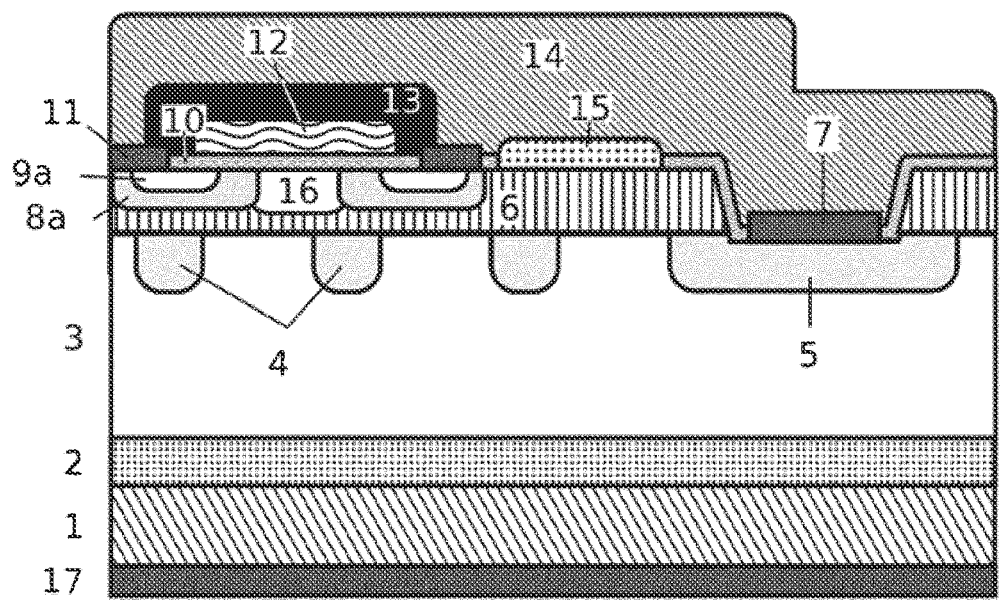
FIG. 1a shows a cross section schematic of the integration of a DMOSFET and a Schottky rectifier on top of a buried grid (BG) structure according to the present invention. No P+ doping is required between MOSFET and Schottky and the P-well (8a, 8b) doping can be lower. The size of the Schottky contact (15) is not limited by leakage current. There is shown a n-type substrate (1), a n+-type epitaxial buffer layer (2), a n-type drift epitaxial layer (3), a p-type grid layer (4), a p-type feeder layer (5), a n-type epitaxial regrown layer (6), an ohmic contact (7), a p-well region (8a, 8b), a n+ source region (9a, 9b), a gate oxide (10), a source ohmic contact (11), a gate contact (12), an isolation layer (13), a metallization layer (14), a Schottky contact (15), a JFET region (16), and a metallization (17).

Before the invention is disclosed and described in detail, it is to be understood that this invention is not limited to particular compounds, configurations, method steps, substrates, and materials disclosed herein as such compounds, configurations, method steps, substrates, and materials may vary somewhat. It is also to be understood that the terminology employed herein is used for the purpose of describing particular embodiments only and is not intended to be limiting since the scope of the present invention is limited only by the appended claims and equivalents thereof.

It must be noted that, as used in this specification and the appended claims, the singular forms "a", "an" and "the" include plural referents unless the context clearly dictates otherwise.

"Buried grid" as used throughout the description and the claims denotes a grid structure of a material with one conductivity type in a material with the opposite conductivity type.

"Conductivity type" as used throughout the description and the claims denotes the type of conduction in a semiconductor material. N-type denotes electron conduction meaning that excess electrons move in the semiconductor giving a current flow and p-type denotes hole conduction, meaning that excess holes move in the semiconductor giving a current flow. A n-type semiconductor material is achieved by donor doping and a p-type semiconductor by acceptor dopants. In SiC, nitrogen is commonly used as donor dopant and aluminum as acceptor dopant. If a material is a doped semiconductor such as SiC, the material either has conductivity type p or conductivity type n. A skilled person realizes that in a semiconductor device all n-doped materials can be exchanged to p-doped materials when all p-doped materials are exchanged to n-doped materials, i.e. n and p can change place, and still a similar device can be obtained.

"Doped" as used throughout the description and the claims denotes that an intrinsic semiconductor such as SiC has got added impurities to modulate its electrical properties and become an extrinsic semiconductor.

"Epitaxial" as used throughout the description and the claims denotes that the material has been manufactured with epitaxial growth, in this case epitaxial growth of SiC.

"Substrate" as used throughout the description and the claims denotes a piece of material on which the power device is built up.

If nothing else is defined, any terms and scientific terminology used herein are intended to have the meanings commonly understood by those of skill in the art to which this invention pertains.

In a first aspect there is provided a device comprising the following parts:
a n-type substrate (1),
a n-type drift epitaxial layer (3) on the n-type substrate (1),
a n-type epitaxial regrown layer (6) on the n-type drift epitaxial layer (3),
a p-type grid layer (4) comprising a grid in the n-type drift epitaxial layer (3) and in contact with the n-type epitaxial regrown layer (6),
a p-type feeder layer (5) in the n-type drift epitaxial layer (3) and in contact with the n-type epitaxial regrown layer (6), the grid layer (4) and the p-type feeder layer (5) are connected,
an ohmic contact (7) applied at least partially on the p-type feeder layer (5),
a p-well region (8a, 8b),
a n$^+$ source region (9a, 9b),
a gate oxide (10),
a source ohmic contact (11),
the ohmic contact (7) is connected to the source ohmic contact (11) through a metallization layer (14),
the p-well region (8a, 8b) is arranged so that it is in contact with the n-type epitaxial regrown layer (6), the n$^+$ source region (9a, 9b), the gate oxide (10), and the source ohmic contact (11),
the n$^+$ source region (9a, 9b) is arranged so that it is in contact with the p-well region (8a, 8b), the gate oxide (10), and the source ohmic contact (11),
a gate contact (12),
an isolation layer (13) for the gate contact (12) area insulation from the metallization layer (14),
the gate oxide (10) is in contact with the p-well region (8a, 8b), the n$^+$ source region (9a, 9b), the gate contact (12), and the isolation layer (13),
the gate oxide (10) is optionally in contact with the n-type epitaxial regrown layer (6) and source ohmic contact (11),
a Schottky contact (15)
the metallization layer (14) applied at least partially on the device and in contact with the Schottky contact (15), and the Schottky contact (15) in contact with the n-type epitaxial regrown layer (6),
a drain ohmic contact and a metallization (17).

The skilled person realizes that even if the claims and the description define a n-type substrate (1), a n-type drift epitaxial layer (3), and a p-type grid layer (4) and so on, all n-type and p-type materials can be interchanged so that all n-doped (n-type) materials are p-doped (p-type) materials and so that all p-doped (p-type) materials are n-doped (n-type) materials. Today the most common commercially available substrates are n-type and thus a n-type substrate has been chosen in the claims and in the description, but the invention can with equally good result be used if all n-type and p-type materials are interchanged.

In one embodiment the device comprises a n$^+$-type epitaxial buffer layer (2) between the n-type substrate (1) and the n-type drift epitaxial layer (3).

In one embodiment the device comprises a JFET region (16) in contact with the n-type epitaxial regrown layer (6), the p-well region (8a), and the gate oxide (10). In one embodiment the JFET region is a n-type doped JFET region.

In one embodiment the p-well region comprises an implanted layer (8a).

In one embodiment the p-well region comprises an epitaxial layer (8b).

In one embodiment the n$^+$ source region comprises an implanted layer (9a).

In one embodiment the n$^+$ source region comprises an epitaxial layer (9b).

In one embodiment the gate contact (12) comprises polysilicon.

In one embodiment the Schottky contact (15) comprises a metal.

In one embodiment the Schottky contact (15) comprises polysilicon.

In one embodiment the Ohmic contact (7) comprises a metal. In such an embodiment the Ohmic contact (7) is called metallic Ohmic contact.

In one embodiment the p-type grid layer (4) comprises a plurality of grids, wherein at least a part of the grids has a ledge positioned centered under the grid, said ledge positioned towards the n-type substrate (1), said ledge having a smaller lateral dimension than the grid. This feature increases the electric field shielding efficiency of the grid which is reducing the electric field on the surface of the device. This increases the blocking voltage and lowers the leakage current without adding forward resistance. Alternatively a wider grid spacing can be used with this design, leading to lower on-resistance. The structure is more tolerant to process variations such as misalignment, dose and energy variation in ion implantation, etching depth etc.

In one embodiment the p-type grid layer (4) comprises a plurality of grids and wherein each grid comprises an upper part and a lower part said lower part is towards the n-type substrate (1), and wherein the upper part is manufactured using epitaxial growth and wherein the lower part is manufactured using ion implantation. In this embodiment it is possible to manufacture a grid with rounded corners as well as an upper part with a high doping level. It is possible to manufacture a component with efficient voltage blocking, high current conduction, low total resistance, high surge current capability, and fast switching.

Figure 1B:
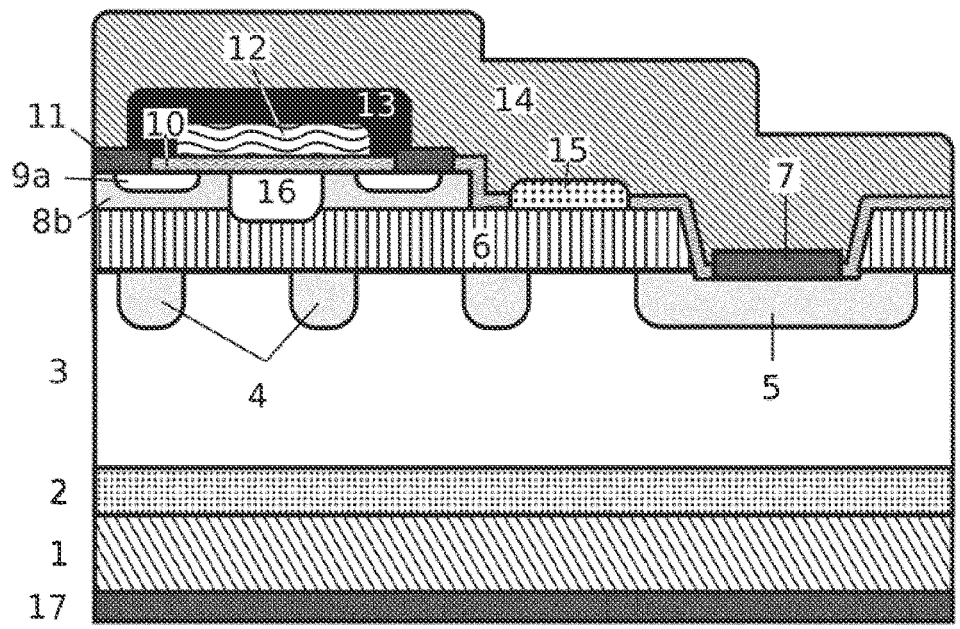
FIG. 1b shows an embodiment as in FIG. 1a, but the Schottky contact (15) is etched down below the P-well epitaxial layer (8b).
Figure 2:
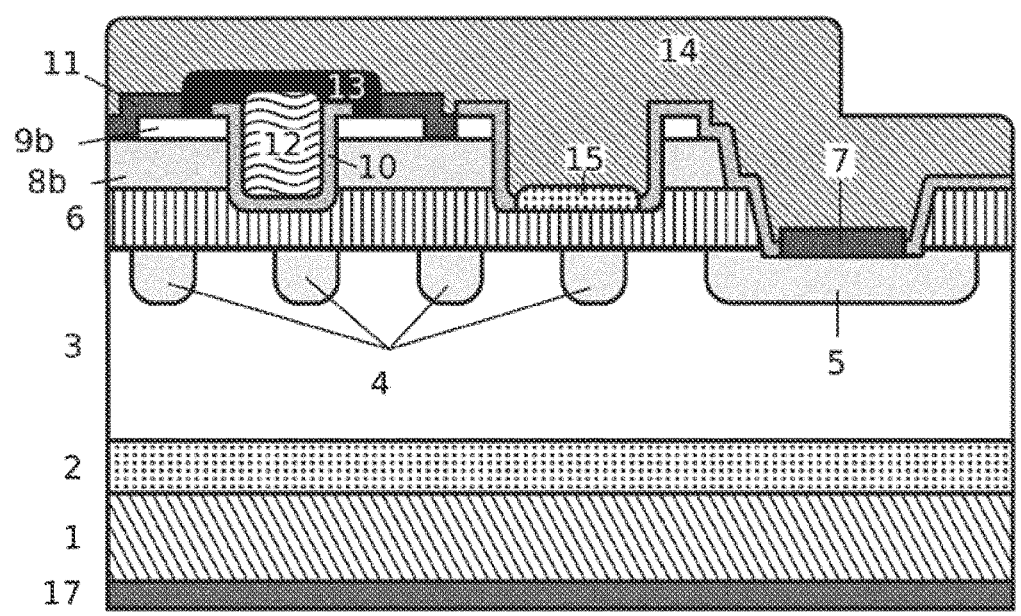
FIG. 2 shows a cross section schematic of the integration of a trench MOSFET and a Schottky rectifier on top of a BG. No surface area is needed for shielding the electric field at the trench corners or the Schottky contact (15). The size of the Schottky contact (15) is not limited by leakage current.

The embodiments depicted in FIGS. 1*a*, 1*b* and 2 are representations of repeating unit cells with a MOSFET and a Schottky diode that are intended to be repeated in a device. The shared drift layer and the presence of the buried grid allows different designs regarding how the repeating units are repeated. In one embodiment of a device the structure (8-13) (M) and the Schottky contact (15) (S) are repeated so that the structure (8-13) and the Schottky contact (15) are alternating where a Schottky contact (15) is between every structure (8-13). (-M-S-M-S-M-S-M-).

In one embodiment there is a Schottky contact (15) (S) between every second structure (8-13) (M) so that the structure is -M-M-S-M-M-S-M-M-S-M-M-. Other combinations are also encompassed. All embodiments include at least one Ohmic contact (7) as well as other necessary features.

In one embodiment the metallization layer (14) is applied on the surface of the device so that it is in contact with all exposed parts except the gate (12).

In one embodiment the n-type epitaxial regrown layer (6) comprises at least two n-type epitaxial regrown layers with different doping levels and thickness as either drift layers or as current spreading layer. A current spreading layer improves the distribution of the current and can thus improve the performance of the device. In one embodiment the n-type epitaxial regrown layer (6) closest to the p-type grid layer (4) has a higher doping concentration compared to the n-type epitaxial regrown layer (6) furthest away from the p-type grid layer (4). In another embodiment the n-type epitaxial regrown layer (6) closest to the p-type grid layer (4) has a lower doping concentration compared to the n-type epitaxial regrown layer (6) furthest away from the p-type grid layer (4). In one embodiment the n-type epitaxial regrown layer (6) has a gradient in the doping concentration. In one embodiment the gradient has the highest doping concentration closest to the p-type grid layer (4). In another embodiment the gradient has the lowest doping concentration closest to the p-type grid layer (4). In one embodiment there is a gradient from low to high to low going away from the p-type grid layer (4). In one such embodiment the doping concentration in the n-type epitaxial regrown layer (6) is lower closest to the p-type grid layer (4) and furthest away from the p-type grid layer (4) compared to the middle part of the n-type epitaxial regrown layer (6).

In one embodiment the p-type grid layer (4) has a repeating structure in at least a first direction, the repeating structure repeats with a regular distance in at least the first direction, and wherein the structure (8-13) and the Schottky contact (15) have a repeating structure in at least a second direction, the repeating structure repeats with a regular distance in at least the second direction. The first direction is any direction selected so that there is a repeating structure that repeats itself regularly when moving along the selected direction. To determine if there is a repeating structure in a direction a line in that direction is drawn and any structures crossing the line are investigated to see if the structures repeat. The distance from one repeating feature to the next corresponding repeating feature is called the pitch. The same applies to the second direction. The first and second directions may be the same or different.

In one embodiment, along any possible defined direction, the distance between repeating structures of the p-type grid layer (4) is not the same as the distance between the repeating structures of the structure (8-13) and the Schottky contact (15), the distances measured along the same direction. Thus there is no alignment between the repeating structure of the p-type grid layer (4) and the repeating structures of (8-13) and (15). This is an advantage regarding manufacture of components since the p-type grid layer (4) can be designed for having many different repeating structures on top.

In one embodiment the repeating structures are in different directions, so that the first direction is not the same as the second direction. In an alternative embodiment the repeating structures are in the same directions, i.e. the first and second directions are the same. In one embodiment the repeating structures are combinations of lines forming a grid and hexagons. In another embodiment the repeating structures are combinations of lines forming a grid and squares. Other combinations are also encompassed.

Figure 4:
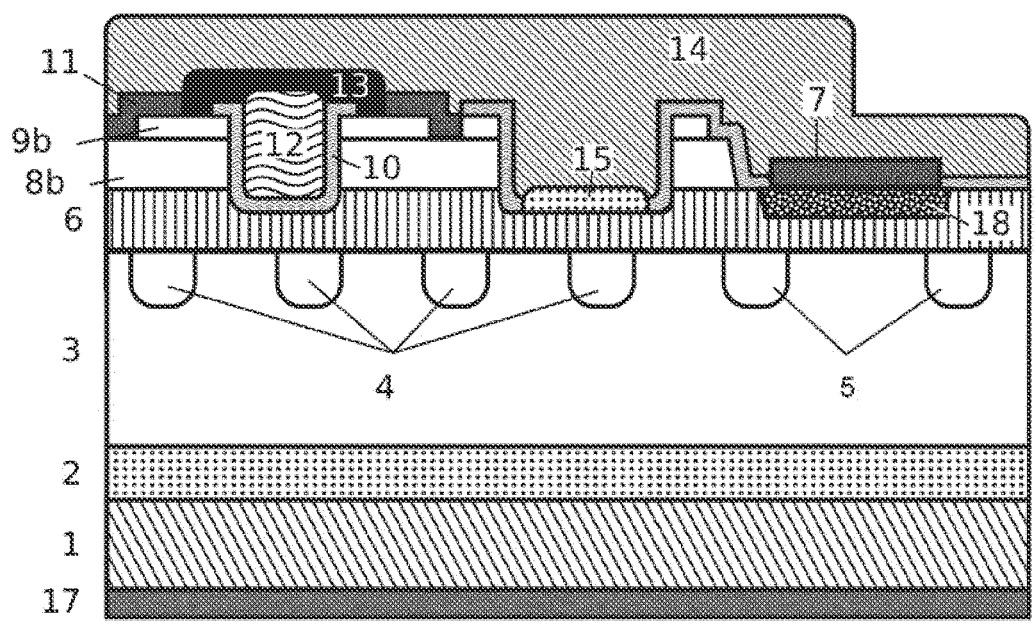
FIG. 4 shows an embodiment of the present invention. There is shown a n-type substrate (1), a n+-type epitaxial buffer layer (2), a n-type drift epitaxial layer (3), a p-type grid layer (4), a p-type feeder layer (5), a n-type epitaxial regrown layer (6), an ohmic contact (7), a p-well region (8a, 8b), a n+ source region (9a, 9b), a gate oxide (10), a source ohmic contact (11), a gate contact (12), an isolation layer (13), a metallization layer (14), a Schottky contact (15), a metallization (17), and an epitaxially grown p-type region (18). In this particular embodiment the p-type feeder layer (5) is applied only dose to the corners of the epitaxially grown p-type region (18) in order to alleviate the effects of the corners. As seen from FIG. 4 there is a distance between the upper part of the p-type feeder layer (5) and the lower part of the epitaxially grown p-type region (18). This distance is within the interval 0-5 μm.
Figure 5:
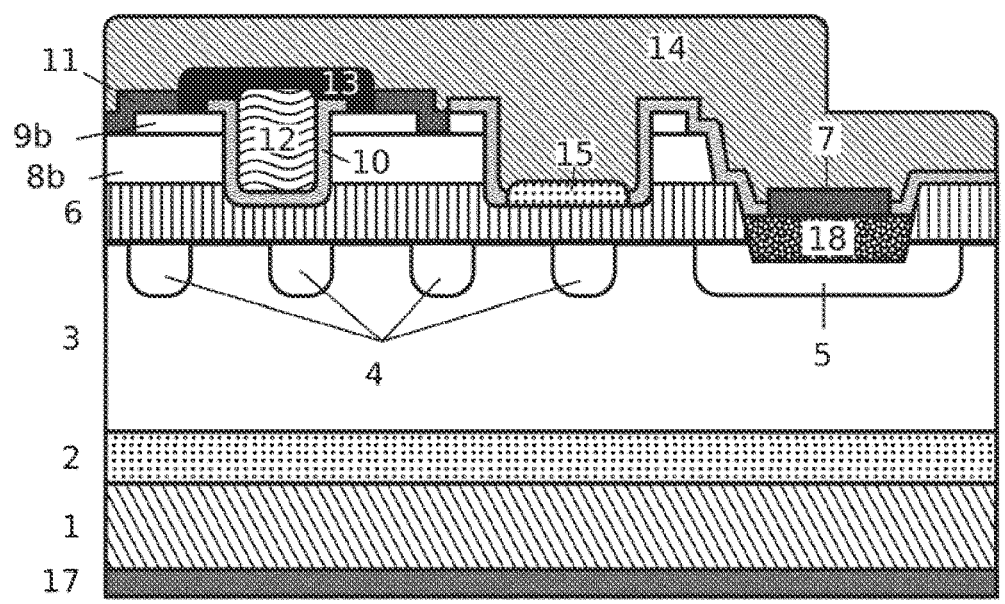
FIG. 5 shows another embodiment according to the invention with the same parts as in FIG. 4 and almost the same device as in FIG. 4, except that the configuration of the p-type feeder layer (5) and the epitaxially grown p-type region (18).
Figure 6:
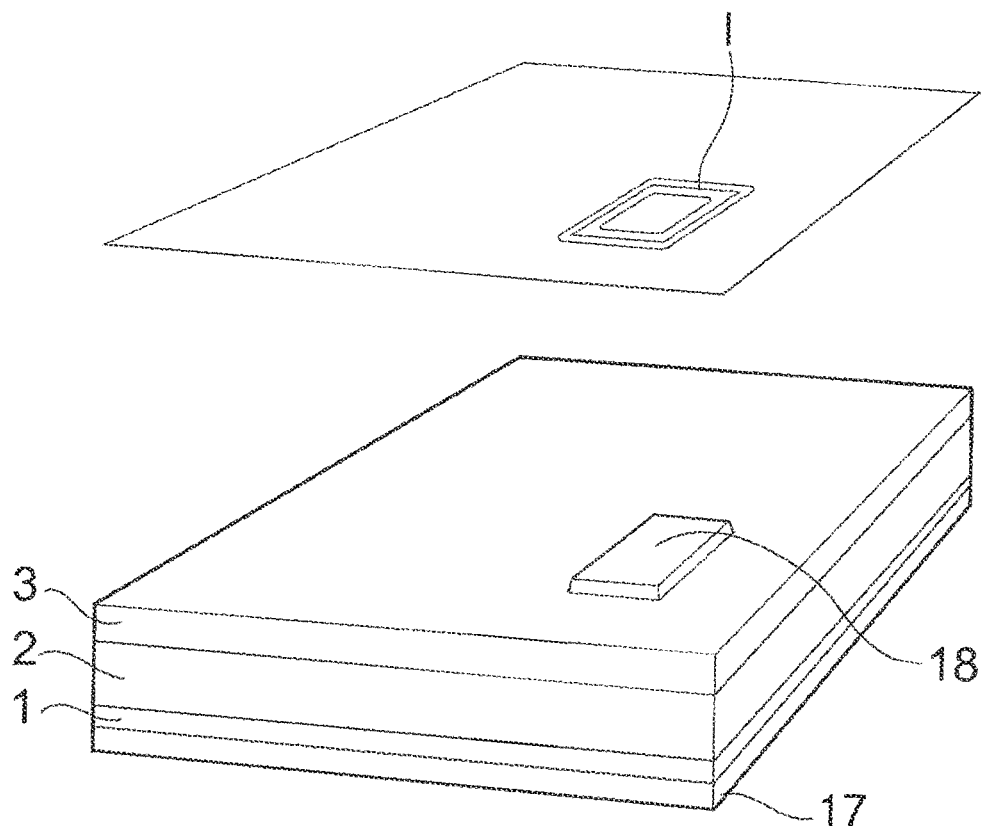
FIG. 6 shows parts of a device according to the invention, some parts are not shown for clarity. There is shown a metallization layer (17), a n-type substrate (1), a n+-type epitaxial buffer layer (2), a n-type drift epitaxial layer (3) and an epitaxially grown p-type region (18), as well as a plane parallel with the n-type substrate (1) and the projection of the epitaxially grown p-type region (18) in the plane including the boundary line (l) of the projection in the plane. The surrounding of the boundary line (l) in the plane is indicated with solid lines, so that the distance from the boundary line (l) to any point in the surrounding is maximum 0.5 µm. Any corners of the surrounding area are rounded so that the surrounding around the line is determined by a circle with radius 0.5 µm which is moved along the boundary line (l).

In one embodiment there is at least one epitaxially grown p-type region (18) in contact with the ohmic contact (7), wherein the p-type feeder layer (5) comprises at least one region for each epitaxially grown p-type region (18), wherein a projection of the epitaxially grown p-type region (18) in a plane parallel with the n-type substrate (1) has a boundary line (l) limiting the projection of the epitaxially grown p-type region (18), wherein the p-type feeder layer (5) is applied at least so that a projection of the p-type feeder layer (5) in a plane parallel to the n-type substrate (1) is in a surrounding of the boundary line (l), so that the distance from the boundary line (l) to any point in the surrounding is maximum 0.5 µm and wherein the p-type feeder layer (5) also is applied so that the distance from the lower part of the epitaxially grown p-type region (18) to the upper part of the p-type feeder layer (5) is in the range 0-5 µm, the direction up is given by the direction perpendicular away from the n-type substrate (1). Embodiments including at least one epitaxially grown p-type region (18) are depicted in FIG. 4. Advantages of this embodiment include a higher surge current capability due to lower forward voltage drop due to improved injection efficiency due to the highly-doped epitaxially grown p-type region (18) which is possible using this technology. Further there is design flexibility for different voltage classes by changing the dimensions and doping profile of the p-type feeder layer (5) and the epitaxially grown p-type region (18). A view of the substrate including the epitaxially grown p-type region (18) and its projection in a plane parallel with the n-type substrate (1) is shown in FIG. 6. The surrounding of the boundary line (l) can be determined so that a circle with radius 0.5 μm is moved along the boundary line (l) and the area swept over by the circle is within the surrounding so that the distance from the boundary line (l) to any point in the surrounding is maximum 0.5 μm. This is applicable to any shape of the boundary fine (l). If the epitaxially grown p-type region (18) has the form of a very long trench there may be two boundary lines. If viewed from above, i.e. from a position looking at the largest area of the n-type substrate (1), then the p-type feeder layer (5) is applied close to the boundary of the epitaxially grown p-type region (18), more in particular within ±0.5 μm from the boundary line. This defines a surrounding of ±0.5 μm from the boundary line and the p-type feeder layer (5) is applied at least in this surrounding, it can also be applied outside this surrounding. The p-type feeder layer (5) should also be applied fairly close to the epitaxially grown p-type region (18), seen from the side, i.e. looking at a cross cut of the device. Then the p-type feeder layer (5) is either in contact with the epitaxially grown p-type region (18), or maximum 5 μm below the epitaxially grown p-type region (18). Since the projection of the epitaxially grown p-type region (18) is used to determine the boundary line (l), the largest part of the epitaxially grown p-type region (18) determines the position of the p-type feeder layer (5). Since the cross section of the p-type feeder layer (5) in the direction shown in FIG. 4 is fairly close to rectangular, the condition will imply that the p-type feeder layer (5) is applied at least close to the corners where they will mitigate the effects of the sharp corners on the electrical field.

The invention is a solution for integrating a power MOSFET and a Schottky diode with a high integration density. This is done by using a buried grid (BG) as junction barrier to shield the electric field in blocking by a separate layer. By this the whole surface area can be used for MOSFET and Schottky structures without sacrificing area for special structures to lower the electric field. The MOSFET and Schottky diode can be placed very close to each other in the same unit cell, and thus share the same drift layer. The size of the Schottky contact is not limited by the shielding from the MOSFET, and the ratio between MOSFET area and Schottky diode area can be chosen freely.

The grid layer shields the top layers against high electric field. For a DMOSFET the p-well doping concentration can thus be lower than in standard DMOSFET structures. A lower p-well doping concentration leads to a higher channel mobility, and thus lower resistance and increased current density. So, with the BG design, integration of a DMOSFET and a Schottky diode will not drastically increase the die size for the same current rating compared to existing DMOSFET technologies.

Figure 3:
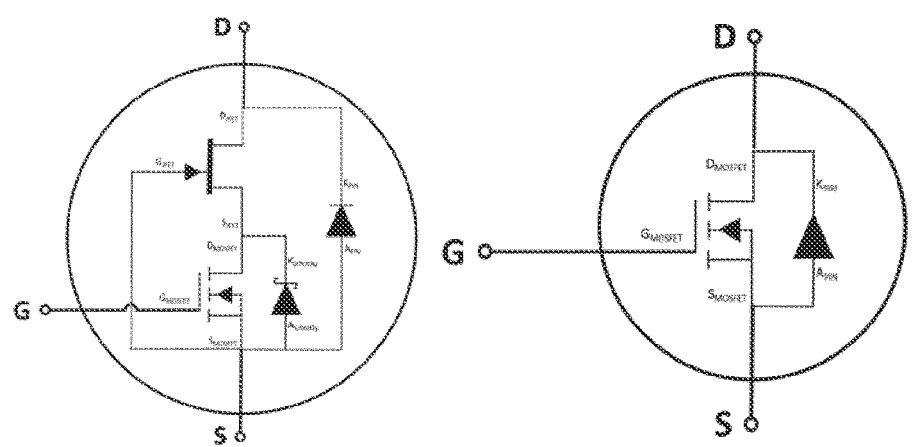
FIG. 3 left figure—Equivalent electronic circuit of structures displayed on FIG. 1 and FIG. 2 according to the invention. Right figure—Standard MOSFET with body diode.

The anode of the Schottky diode and the source contact of the MOSFET are connected through a thick metallization layer (14). A high level surge current capability is defined by the BG feeders (5) and the contact areas to the feeders (7). The equivalent device schematic is displayed in FIG. 3.

The design of feeders to the BG makes it possible to choose at which voltage the feeder PN diode (3, 5, 7) and the BG (4) should be conducting since there is a voltage drop between Schottky contact (15) and BG (4, 5). High current levels in the PN junction can cause so called bipolar degradation. The PN junction diode (3, 5, 7) is not active during normal operation, but serves as a protection for surge over-currents. In addition, the BG (4) being physically separated from the p-well (8a, 8b) of the MOSFET insures avalanche capability of the device in blocking mode, thus providing additional protection function.

The integration of a MOSFET and a Schottky diode does not add extra photolithographic steps. One can use the polysilicon gate contact as a Schottky contact as disclosed for instance in Stephani, D., & Friedrichs, P. (2006). Silicon carbide junction field effect transistors. *International journal of high speed electronics and systems,* 16(03), 825-854, the disclosure of which is incorporated in its entirety. The other way is to deposit in the same process step a thin Schottky contact layer (e.g. Ti, Ni . . . ) and a thick metal layer (e.g. Al, Ag . . . ).

If necessary, the isolation layer (13) can be used instead of the gate oxide layer (10) for patterning the Schottky contact (15) area.

The invention claimed is:

1. A semiconductor device for electrical communication with a source, a gate, and a drain, the semiconductor device comprising:
 a buried grid structure having a substrate and a drift layer, the drift layer disposed on the substrate;
 a MOSFET structure integrated on the drift layer of the buried grid structure, the MOSFET structure having: a first source node for electrical communication with the source, a first drain node for electrical communication with the drain, and a first gate node for electrical communication with the gate;
 a Schottky diode structure integrated on the same drift layer of the buried grid structure adjacent the MOSFET structure, the Schottky diode structure connected in parallel to the MOSFET structure, the Schottky diode structure having a first anode for electrical communication with the source and having a first cathode for electrical communication with the drain; and
 a diode structure integrated on the semiconductor device and connected in parallel to the MOSFET structure and the Schottky diode structure, the diode structure having a second anode for electrical communication with the source and having a second cathode for electrical communication with the drain.

2. The semiconductor device of claim 1, wherein the buried grid structure comprises:
 a drift epitaxial layer for the drift layer being n-type and being disposed on the substrate, the substrate being n-type;
 a grid layer being p-type and comprising a grid disposed on the drift epitaxial layer; and
 an epitaxial regrown layer being n-type and being disposed on the drift epitaxial layer, the epitaxial regrown layer disposed in contact with the grid layer and with portion of the feeder layer.

3. The semiconductor device of claim 1, wherein the buried grid structure comprises:
 a drift epitaxial layer for the drift layer being n-type and being disposed on the substrate, the substrate being n-type; and
 an epitaxial regrown layer being n-type and being disposed on the drift epitaxial layer.

4. The semiconductor device of claim 3, wherein the MOSFET structure comprises:
 a well region being p-type and being disposed in contact with the epitaxial regrown layer;
 a source region being n+ type and being disposed in contact with the well region;

a portion of a gate oxide layer disposed in contact across portions of the source region and the well region;

a source ohmic contact for the first source node disposed in the gate oxide layer and disposed in contact with portions of the well region and the source region, the source ohmic contact connected through a metallization layer to the second anode of the diode structure;

a gate contact for the first gate node disposed on the gate oxide layer adjacent the portions of the source region and the well region; and an isolation layer isolating the gate contact from the metallization layer.

5. The semiconductor device of claim 3, wherein the Schottky diode structure comprises:

a Schottky contact disposed in a portion of the gate oxide layer, the metallization layer in contact with the source ohmic contact being disposed in contact with the first anode of the Schottky contact, the Schottky contact disposed on portion of the regrown epitaxial layer as the first cathode.

6. The semiconductor device of claim 3, wherein the diode structure comprises:

a feeder layer being p-type as the second anode and being disposed on the drift epitaxial layer as the second cathode; and another ohmic contact disposed at least partially on the feeder layer, the ohmic contact disposed in contact with the first source node through the metallization layer.

7. The semiconductor device of claim 3, further comprising:

a JFET structure integrated on the semiconductor device, the JFET structure connected in series to the MOSFET structure and the Schottky diode structure, the JFET structure connected in parallel to the diode structure, the JFET structure having: a second gate node for electrical communication with the source; a second source node connected to the first drain node of the MOSFET structure and to the cathode of the Schottky diode; and a second drain node connected to the second cathode of the diode structure for electrical communication with the drain.

8. The semiconductor device of claim 7, wherein the JFET structure comprises a JFET region disposed in contact with the epitaxial regrown layer, the well region, and the gate oxide layer.

9. The semiconductor device of claim 1, wherein the first drain node comprises a drain ohmic contact disposed on a side of the substrate opposite the drift layer.

10. The semiconductor device of claim 1, wherein the device comprises an epitaxial buffer layer being n+ type and disposed between the substrate and the drift epitaxial layer.

11. The semiconductor device of claim 1, wherein the well region comprises an implanted layer or an epitaxial layer; wherein the source region comprises an implanted layer or an epitaxial layer; wherein the gate contact comprises polysilicon; and/or wherein the Schottky contact comprises a metal or polysilicon.

12. The semiconductor device of claim 1, wherein the grid layer comprises a plurality of grids, wherein at least a part of the grids has a ledge positioned centered under the grid, the ledge positioned towards the substrate, the ledge having a smaller lateral dimension than the grid.

13. The semiconductor device of claim 1, wherein the grid layer comprises a plurality of grids; wherein each grid comprises an upper part and a lower part, the lower part being towards the substrate; wherein the upper part is manufactured using epitaxial growth; and wherein the lower part is manufactured using ion implantation.

14. The semiconductor device of claim 1, wherein the epitaxial regrown layer comprises at least two epitaxial regrown layers with different doping levels and thicknesses as either a drift layer or a current spreading layer.

15. The semiconductor device of claim 14, wherein one of the at least two epitaxial regrown layers closest to the grid layer has a higher doping concentration compared to another of the at least two epitaxial regrown layers furthest away from the grid layer;

wherein one of the at least two epitaxial regrown layers closest to the grid layer has a lower doping concentration compared to another of the at least one epitaxial regrown layers furthest away from the grid layer; or wherein the epitaxial regrown layer has a gradient in the doping concentration, the doping concentration in the epitaxial regrown layer being lower closest to the grid layer and furthest away from the grid layer compared to a middle part of epitaxial regrown layer.

16. The semiconductor device of claim 1, wherein the grid layer has a first repeating structure in at least a first direction, wherein the first repeating structure repeats with a first regular distance in at least the first direction, and wherein the MOSFET structure and the Schottky contact have a second repeating structure in at least a second direction, wherein the second repeating structure repeats with a second regular distance in at least the second direction.

17. The semiconductor device of claim 16, wherein along any possible defined direction, a first distance between the first repeating structures of the grid layer is not the same as the second distance between the second repeating structures of the MOSFET structure and the Schottky contact, the first and second distances measured along the same direction.

18. The semiconductor device of claim 1, wherein the MOSFET structure and the Schottky diode structure are repeated alternatingly where the Schottky diode structure is disposed between every MOSFET structure.

19. The semiconductor device of claim 1, comprising at least one epitaxially grown region being p-type and disposed in contact with the ohmic contact, wherein the feeder layer comprises at least one region for each epitaxially grown region, wherein a projection of the epitaxially grown region in a plane parallel with the substrate has a boundary line limiting the projection of the epitaxially grown region, wherein the feeder layer is applied at least so that a projection of the feeder layer in a plane parallel to the substrate is in a surrounding of the boundary line, so that the distance from the boundary line to any point in the surrounding is maximum 0.5 µm and wherein the feeder layer also is applied so that the distance from the lower part of the epitaxially grown region to the upper part of the feeder layer is in the range 0-5 µm, the direction up is given by the direction perpendicular away from the substrate.

* * * * *